(12) United States Patent
Luu et al.

(10) Patent No.: US 11,533,805 B2
(45) Date of Patent: Dec. 20, 2022

(54) COOLING AND COMPRESSION CLAMP FOR SHORT LEAD POWER DEVICES

(71) Applicant: MKS Instruments, Inc., Andover, MA (US)

(72) Inventors: Ky Luu, Victor, NY (US); Aaron T. Radomski, Conesus, NY (US); Dave Coffta, Bergen, NY (US)

(73) Assignee: MKS Instruments, Inc., Andover, MA (US)

( * ) Notice: Subject to any disclaimer, the term of this patent is extended or adjusted under 35 U.S.C. 154(b) by 65 days.

(21) Appl. No.: 17/322,549

(22) Filed: May 17, 2021

(65) Prior Publication Data

US 2021/0274644 A1 Sep. 2, 2021

Related U.S. Application Data

(62) Division of application No. 16/115,692, filed on Aug. 29, 2018, now Pat. No. 11,076,477.

(Continued)

(51) Int. Cl.
*H01L 23/40* (2006.01)
*H05K 1/02* (2006.01)
(Continued)

(52) U.S. Cl.
CPC ...... *H05K 1/0209* (2013.01); *H01J 37/32174* (2013.01); *H01L 23/40* (2013.01);
(Continued)

(58) Field of Classification Search
None
See application file for complete search history.

(56) References Cited

U.S. PATENT DOCUMENTS 4,069,497 A * 1/1978 Steidlitz .............. H01L 23/4334
257/722
4,259,685 A * 3/1981 Romano ............. H01L 23/4006
257/796
(Continued)

FOREIGN PATENT DOCUMENTS

CN 201733513 U 2/2011
CN 102648672 A 8/2012
(Continued)

OTHER PUBLICATIONS

Korean Office Action regarding Application No. 10-2020-7012672, dated Sep. 27, 2021.

(Continued)

*Primary Examiner* — Courtney L Smith
(74) *Attorney, Agent, or Firm* — Harness, Dickey & Pierce, P.L.C.

(57) ABSTRACT

A clamp configured to be coupled to a printed circuit board to cool and compress one or more electrical connections subject to repeated power and thermal cycling. A first conductive column of the clamp is configured to compress a first electrical connection between a first power device lead and a first printed circuit board trace of the printed circuit board, and draw thermal energy away from the first power device lead. The first conductive column extends from a load spreading plate. The load spreading plate is an insulator that electrically isolates a fastener extending therefrom from the first conductive column. The fastener is configured to cooperate with the circuit board to connect the clamp to the circuit board, compress the load spreading plate against the first conductive column to compress the first electrical connection, and connect the clamp to ground.

6 Claims, 1 Drawing Sheet

Related U.S. Application Data

Figure 1:
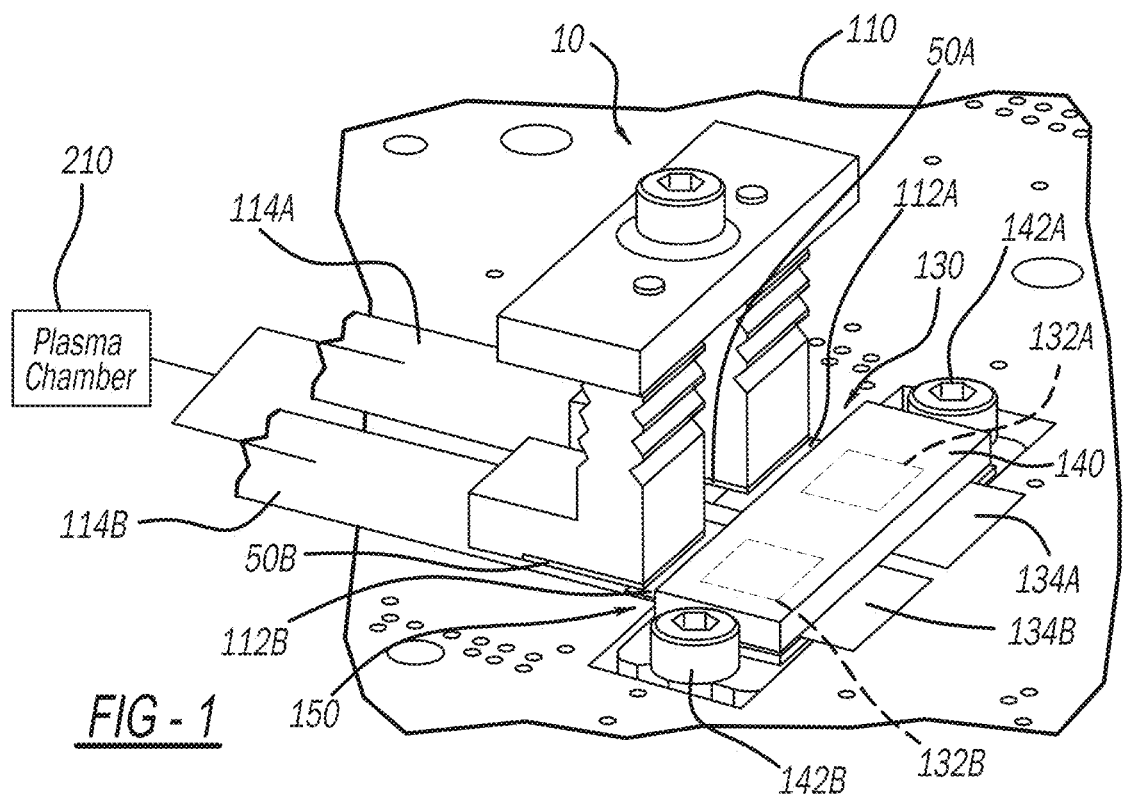

(60) Provisional application No. 62/567,505, filed on Oct. 3, 2017.

(51) Int. Cl.
 *H01R 4/02* (2006.01)
 *H01J 37/32* (2006.01)

(52) U.S. Cl.
 CPC .............. *H01R 4/02* (2013.01); *H05K 1/0263* (2013.01); *H05K 1/0271* (2013.01)

(56) References Cited

U.S. PATENT DOCUMENTS

| | | | |
|---|---|---|---|
| 4,638,404 A * | 1/1987 | Grossmann | H01L 23/4006 174/16.3 |
| 5,047,837 A | 9/1991 | Kitano et al. | |
| 5,168,425 A | 12/1992 | Radack, Jr. | |
| 5,251,098 A * | 10/1993 | Schmidt | H01L 23/4006 174/16.3 |
| 5,315,232 A * | 5/1994 | Stewart | G01R 29/12 324/72 |
| 5,592,021 A * | 1/1997 | Meschter | H01L 23/4006 257/726 |
| 5,850,104 A * | 12/1998 | Avis | H01L 23/4006 257/726 |
| 5,949,649 A | 9/1999 | Bartlow | |
| 6,328,096 B1 | 12/2001 | Stone et al. | |
| 8,693,200 B2 * | 4/2014 | Colgan | H01L 23/4093 361/679.52 |
| 9,147,634 B2 | 9/2015 | Kodama | |
| 9,165,856 B2 * | 10/2015 | Youn | H01L 24/91 |
| 9,991,609 B2 * | 6/2018 | Hoehn | H01L 25/072 |
| 10,753,275 B2 * | 8/2020 | Mills | H01M 14/00 |
| 2007/0285888 A1 | 12/2007 | Kearns et al. | |
| 2009/0261471 A1 * | 10/2009 | Frey | H01L 23/13 257/E23.06 |
| 2010/0103578 A1 * | 4/2010 | Davies | H01L 27/0262 361/86 |
| 2014/0070387 A1 | 3/2014 | Youn et al. | |
| 2016/0088771 A1 | 3/2016 | Schoerner | |

FOREIGN PATENT DOCUMENTS

| | | |
|---|---|---|
| CN | 106449005 A | 2/2017 |
| DE | 3005313 A1 | 8/1981 |
| JP | H08181474 A | 7/1996 |
| JP | H09293981 A | 11/1997 |
| JP | 2005183644 A | 7/2005 |
| JP | 2009253231 A | 10/2009 |
| TW | 201039501 A | 11/2010 |

OTHER PUBLICATIONS

International Search Report and Written Opinion of the International Searching Authority for International App. No. PCT/US2018/053418, dated Jan. 18, 2019.

Taiwan Office Action for App. No. 107133038 dated Sep. 20, 2019, and its English translation thereof.

International Preliminary Report on Patentability for PCT Patent App. No. PCT/US2018/053418, dated Apr. 7, 2020.

Chinese Office Action for Chinese Application No. 201880076777.2, dated Dec. 30, 2020, and its English translation thereof.

Extended European Search Report regarding EP 18864415.7, dated Jun. 3, 2021.

Office Action regarding Chinese Application No. 201880076777.2, dated Aug. 23, 2021.

\* cited by examiner

COOLING AND COMPRESSION CLAMP FOR SHORT LEAD POWER DEVICES

CROSS REFERENCE TO RELATED APPLICATIONS

This application is a Division of U.S. patent application Ser. No. 16/115,692, filed on Aug. 29, 2018, which claims the benefit of U.S. Provisional Application No. 62/567,505, filed on Oct. 3, 2017. The entire disclosures of the above applications are incorporated herein by reference.

FIELD

The present disclosure relates to a cooling and compression clamp for electrical connections subject to repeated power and thermal cycling.

BACKGROUND

This section provides background information related to the present disclosure, which is not necessarily prior art.

Solder fatigue may occur at soldered electrical connections that experience repeated thermal expansion and contraction during normal use. Solder fatigue is a common challenge for radio frequency (RF) power conversion systems, which experience thousands to millions of power cycles during their application lifetime (e.g., RF plasma generators used in semiconductor manufacturing). Critical parameters that determine the ultimate lifetime of a solder joint include temperature excursion (ΔT), and mechanical strain induced by coefficient of thermal expansion (CTE). Repeated power and/or thermal cycling can cause the solder to creep and possibly fracture, causing a high resistance connection and potential connection failure.

While such current solder connections are suitable for their intended use, they are subject to improvement. The present teachings include a cooling and compression clamp for short lead power devices that advantageously reduces solder fatigue. The present teachings provide for numerous additional advantages and unexpected results, as explained in detail herein and as one skilled in the art will appreciate.

SUMMARY

This section provides a general summary of the disclosure, and is not a comprehensive disclosure of its full scope or all of its features.

The present teachings include a clamp configured to be coupled to a printed circuit board to cool and compress one or more electrical connections subject to repeated power and thermal cycling. A first conductive column of the clamp is configured to compress a first electrical connection between a first power device lead and a first printed circuit board trace of the printed circuit board, and draw thermal energy away from the first power device lead. The first conductive column extends from a load spreading plate. The load spreading plate is an insulator that electrically isolates a fastener extending therefrom from the first conductive column. The fastener is configured to cooperate with the circuit board to connect the clamp to the circuit board, compress the load spreading plate against the first conductive column to compress the first electrical connection, and connect the clamp to ground.

The present teachings further include a clamp configured to be coupled to a printed circuit board to cool and compress one or more electrical connections subject to repeated power and thermal cycling. The clamp includes a conductive column configured to compress an electrical connection between a drain lead from a transistor of a transistor package and a printed circuit board trace that supplies energy to an RF plasma output network. The conductive column is also configured to draw thermal energy away from the first drain lead to cool the first drain lead. The conductive column extends from a load spreading plate. A fastener extends from the load spreading plate, which is an insulator that electrically isolates the fastener from the conductive column. The fastener is configured to: cooperate with the circuit board to connect the clamp to the circuit board; and compress the load spreading plate against the conductive column to compress the electrical connection.

The present teachings also include a circuit board for an RF plasma generator that provides solid state power for thin films processing equipment. The circuit board includes a first transistor mounted to the circuit board with a retention member. A first drain lead extends from the first transistor. A first printed circuit board trace is for supplying energy to an RF plasma output network. The first printed circuit board trace is connected to the first drain lead to provide a first electrical connection therebetween. A first conductive column compresses the first electrical connection between the first printed circuit board trace and the first drain lead, and is configured to draw thermal energy away from the first drain lead to cool the first drain lead. The first column extends from a load spreading plate. A fastener extends from the load spreading plate. The load spreading plate is an insulator that electrically isolates the fastener from the first conductive column. The fastener is configured to: cooperate with the circuit board to connect the clamp to the circuit board; and to compress the load spreading plate against the first conductive column to compress the first electrical connection.

Further areas of applicability will become apparent from the description provided herein. The description and specific examples in this summary are intended for purposes of illustration only and are not intended to limit the scope of the present disclosure.

DRAWINGS

Figure 2:
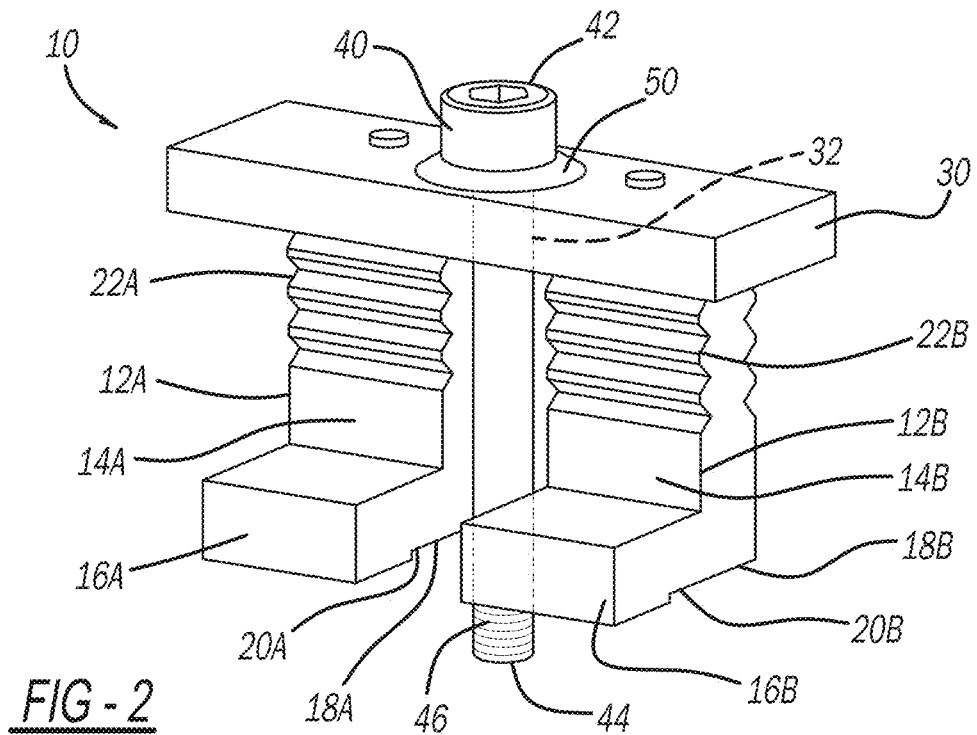

FIG. 1 illustrates a clamp in accordance with the present teachings, which is coupled to a printed circuit board to cool and compress electrical connections subject to repeated power and thermal cycling; and FIG. 2 is an isolated perspective view of the clamp of FIG. 1.

Corresponding reference numerals indicate corresponding parts throughout the several views of the drawings.

DETAILED DESCRIPTION

FIGS. 1 and 2 illustrate a cooling and compression clamp 10 in accordance with the present teachings. The clamp 10 is configured to be coupled to a printed circuit board no to cool and compress one or more electrical connections subject to repeated power and thermal cycling. The clamp 10 includes the first column 12A. The first column 12A is made of any suitable conductive metal, such as copper. In the example illustrated, the column 12A includes a leg 14A and a foot 16A, which is generally a base of the column 12A. An undersurface 18A of the foot 16A contacts an electrical connection in order to compress the electrical connection and conduct thermal energy from the connection, as explained herein. To accommodate the electrical connection, the undersurface 18A may define a recess 20A.

To facilitate dispersion of thermal energy from the column 12A, and ultimately from the electrical connection, the column 12A may include one or more thermal energy dispersion surfaces. The thermal energy dispersion surfaces may be located at any suitable position about the column 12A, such as along the leg 14A. The thermal dispersion surfaces can be any suitable surface feature to facilitate release of thermal energy conducted to the column 12A from the electrical connection. In the example illustrated, the thermal energy dispersion surfaces are in the form of first grooves 22A.

In the example illustrated, the clamp 10 further includes a second column 12B in addition to a first column 12A. The second column 12B can be the same as, or similar to, the first column 12A. Therefore, the description of the first column 12A also describes the second column 12B. The features of the second column 12B that are the same as, or similar to, the features of the first column 12A are designated in the drawings with the same reference numerals, but with the suffix "B" rather than "A."

Although the clamp 10 is illustrated as including both the first column 12A and the second column 12B, the clamp 10 can be provided with only a single column or more than two columns. For example, FIG. 1 illustrates a transistor package 130 in the form of a Gemini package, which has two electrical connections associated therewith, as explained further herein. Thus the exemplary clamp 10 of FIG. 1 includes two columns 12A and 12B—one for each electrical connection to be compressed and cooled. The number of columns that the clamp 10 includes will generally correspond to the number of electrical connections to be compressed and cooled.

The clamp 10 further includes a load spreading plate 30. The load spreading plate 30 is an insulator, and can be made of any suitable insulative material, such as fiberglass. Both the first column 12A and the second column 12B extend from the plate 30. The first and second columns 12A and 12B are connected to the plate 30 in any suitable manner. For example, the clamp 10 can be preassembled as a single unit with the first and second columns 12A and 12B attached to the load spreader plate 30 by way of pin pressing and riveting. The plate 30 defines a bore 32, which extends through the plate 30. The bore 32 is sized and shaped to receive any suitable fastener 40 configured to secure the clamp 10 to the circuit board 110. In the example illustrated, the fastener 40 is a screw including a head 42 and a shaft 44, which extends from the head 42. Between the fastener 40 (specifically the head 42 thereof) and the plate 30 is a compression member 50. The compression member 50 can be any suitable compression member, such as a washer or spring, which facilitates compression of the plate 30 against the columns 12A and 12B to press the columns 12A and 12B onto the electrical connections. If the first column 12A, the second column 12B, and the fastener 40 are at the same electrical potential, the plate 30 may alternatively be constructed as a conductive material.

At a distal end of the shaft 44 are threads 46, which cooperate with a receptacle of the circuit board 110 in order to secure the clamp 10 to the circuit board 110. The shaft 44 connects to ground in order to ground the clamp 10. The plate 30 advantageously electrically isolates the fastener 40 from the first column 12A and the second column 12B. The plate 30 also isolates RF and DC signals.

As illustrated in FIG. 1, the clamp 10 is positioned such that the first column 12A is seated over a first electrical connection made between a first power device lead 112A and a first printed circuit board trace (or suitable metal surface) 114A. The second column 12B is arranged over a second electrical connection between a second power device lead 112B and a second printed circuit board trace 114B (or suitable metal surface). The electrical connection between the first power device lead 112A and the first printed circuit board trace 114A, as well as the electrical connection between the second power device lead 112B and the second printed circuit board trace 114B, can be any suitable electrical connection, such as any suitable solder or solderless electrical connection.

In the example illustrated, the first power device lead 112A is a first drain (or source) lead from the transistor package 130, and specifically a first transistor 132A thereof. The second power device lead 112B is a second drain (source) lead from a second transistor 132B of the transistor package 130. A first input or gate lead 134A is connected to the first transistor 132A, and a second input or gate lead 134B is connected to the second transistor 132B. The transistor package 130 further includes a lid 140, which covers the first transistor 132A and the second transistor 132B. The lid 140 is secured to the circuit board 110 in any suitable manner, such as with a first retention member 142A and a second retention member 142B. In the example illustrated, the first printed circuit board trace 114A and the second printed circuit board trace 114B supply power to a plasma chamber 210 for semiconductor manufacturing.

The transistor package 130 is illustrated as a Gemini-style package configured in a push-pull configuration for wideband, low distortion operation. However, any other suitable transistor package can be used. For example, a transistor package including only a single transistor may be used, or multiple transistors can be formed on a single die. The transistor package 130, the first power device lead 112A, the second power device lead 112B, the first input lead 134A and the second input lead 134B, are included with an RF power supply 150. The RF power supply 150 can be any power supply suitable for providing power to the plasma chamber 210 in order to generate a waveform. The present teachings are applicable for use with any suitable RF plasma generators, such as any suitable VHF generator. The clamp 10 can also be used with an MKS EDGE™ platform generator.

With the clamp 10 arranged as illustrated in FIG. 1, when the fastener 40 is screwed to the circuit board 110, the fastener 40 compresses the plate 30 against the first and second columns 12A and 12B, which compresses the first column 12A against the first power device lead 112A, and compresses the second column 12B against the second power device lead 112B. The compression provided by the clamp 10 on the electrical connections is generally constant. This maintains the electrical connections between the first and second power device leads 112A, 112B and the first and second printed circuit board traces 114A, 114B respectively (or any other suitable metal surfaces), even during large temperature fluctuations at the electrical connections, which may result in expansion and contraction of the connection. Furthermore, the clamp 10 advantageously draws thermal energy from the first and second power device leads 112A and 112B by conduction through the first and second columns 12A and 12B, which reduces the temperature of the first and second power device leads 112A and 112B, thereby reducing the possibility of solder fatigue and extending the life of each electrical connection. The columns 12A and 12B are made of high thermal conductive material, such as copper, which is an extremely good material for pulling heat energy from the leads 112A and 112B to the columns 12A and 12B. The energy accumulated in the copper is then radiated to the surrounding air by way of convection and forced air cooling. The clamp 10 also advantageously minimizes parasitic capacitance from the first and second power device leads 112A and 112B to ground, which maintains good RF performance.

To improve heat transfer between the first power device lead 112A and the first column 12A, a thermal interface material 50A may be arranged therebetween. Similarly, to improve heat transfer between the second power device lead 112B and the second column 12B, a thermal interface material 50B may be arranged therebetween. The thermal interface materials 50A and 50B may be any suitable thermal interface materials. For example, the thermal interface materials 50A and 50B may each be a thin sheet (0.25-0.5 mm thick) with adhesive on one side, which is cut to shape and adhered to the undersurfaces 18A and 18B of the columns 12A and 12B respectively.

The clamp 10 is particularly useful in applications where the first power device lead 112A and/or the second power device lead 112B is very short (such as 3.0 mm), which would preclude use of a mechanical fastener, such as a screw, to secure the first and/or second power device leads 112A, 112B to their respective traces 114A, 114B. When the first and second power device leads 112A and 112B are so short, it will also not be possible to form an omega (Ω) loop in the leads 112A, 112B, as is known in the art, to accommodate expansion and contraction of the first and second power device leads 112A and 112B during temperature fluctuations thereof The clamp 10 advantageously reduces the temperatures of the first and second power source device leads 112A and 112B to reduce temperature fluctuations thereof, and maintains the clamp 10 compressed against the leads 112A and 112B to reduce the mechanical strain induced by repeated thermal expansion and contraction (coefficient of thermal expansion (CTE)). As a result, incremental damage to the soldered connections, as estimated by the following formula, is reduced:

$$\Delta D = \left[ \frac{F \cdot DNP \cdot \Delta CTE \cdot \Delta T}{h} \right]$$

In this equation: F=engineering factor, ~1.2 to 0.7 for filleted SJs, ~1.5 to 1.0 for SJs without fillets; DNP=distance from the neutral point/plane; ΔCTE=CTE mismatch; ΔT=cyclic temperature excursion; h=solder joint.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A clamp configured to be coupled to a printed circuit board subject to repeated power and thermal cycling, the clamp comprising:
    a conductive column configured to compress an electrical connection between a drain lead from a transistor of a transistor package and a printed circuit board trace that supplies energy to an RF plasma output network, and configured to draw thermal energy away from the drain lead to cool the drain lead;
    a load spreading plate from which the conductive column extends; and
    a fastener extending from the load spreading plate, the load spreading plate is an insulator that electrically isolates the fastener from the conductive column, the fastener is configured to: cooperate with the printed circuit board to connect the clamp to the circuit board; and compress the load spreading plate against the conductive column to compress the electrical connection.

2. The clamp of claim 1, wherein the transistor package is a Gemini-style package configured in a push-pull configuration for wideband, low distortion operation.

3. The clamp of claim 1, further comprising grooved thermal energy dispersion surfaces on the conductive column.

4. The clamp of claim 1, wherein the fastener connects the clamp to ground.

5. A circuit board for an RF plasma generator that provides solid state power for thin films processing equipment, the circuit board comprising:
    a first transistor mounted to the circuit board with a retention member;
    a first drain lead from the first transistor;
    a first printed circuit board trace for supplying energy to an RF plasma output network, the first printed circuit board trace connected to the first drain lead to provide a first electrical connection therebetween;
    a first conductive column compressing the first electrical connection between the first printed circuit board trace and the first drain lead, and configured to draw thermal energy away from the first drain lead to cool the first drain lead;
    a load spreading plate from which the first conductive column extends; and
    a fastener extending from the load spreading plate, the load spreading plate is an insulator that electrically isolates the fastener from the first conductive column, the fastener is configured to: cooperate with the circuit board to connect the retention member to the circuit board; and compress the load spreading plate against the first conductive column to compress the first electrical connection.

6. The circuit board of claim 5, further comprising:
a second transistor mounted to the circuit board, the first transistor and the second transistor are included with a transistor package;
a second drain lead from the second transistor;
a second printed circuit board trace for supplying energy to the RF plasma output network, the second printed circuit board trace connected to the second drain lead to provide a second electrical connection therebetween;
a second conductive column compressing the second electrical connection between the second printed circuit board trace and the second drain lead, and configured to draw thermal energy away from the first drain lead to cool the first drain lead;
wherein the load spreading plate electrically isolates the second conductive column from both the fastener and the first conductive column; and
wherein the fastener compresses the load spreading plate against the second conductive column to compress the second electrical connection.

* * * * *